(12) United States Patent
Mikolajczak et al.

(10) Patent No.: US 10,790,810 B2
(45) Date of Patent: Sep. 29, 2020

(54) BALANCER FOR MULTIPLE FIELD EFFECT TRANSISTORS ARRANGED IN A PARALLEL CONFIGURATION

(71) Applicant: FAIRCHILD SEMICONDUCTOR CORPORATION, Sunnyvale, CA (US)

(72) Inventors: Adrian Mikolajczak, Los Altos, CA (US); Chang Su Mitter, Los Gatos, CA (US)

(73) Assignee: FAIRCHILD SEMICONDUCTOR CORPORATION, Phoenix, AZ (US)

( * ) Notice: Subject to any disclaimer, the term of this patent is extended or adjusted under 35 U.S.C. 154(b) by 126 days.

(21) Appl. No.: 15/705,718

(22) Filed: Sep. 15, 2017

(65) Prior Publication Data

US 2018/0083611 A1 Mar. 22, 2018

Related U.S. Application Data

(60) Provisional application No. 62/397,567, filed on Sep. 21, 2016.

(51) Int. Cl.
*H03B 1/00* (2006.01)
*H03K 3/00* (2006.01)
*H03K 17/06* (2006.01)
*H03K 17/30* (2006.01)
*H03K 17/12* (2006.01)

(52) U.S. Cl.
CPC ........... *H03K 17/06* (2013.01); *H03K 17/122* (2013.01); *H03K 17/302* (2013.01)

(58) Field of Classification Search
CPC .............................. H03K 17/06; H03K 17/122
USPC .......................................................... 327/109
See application file for complete search history.

(56) References Cited

U.S. PATENT DOCUMENTS

| 8,847,656 B1 * | 9/2014 | A ...................... H03K 17/08122 |
| | | 327/310 |
| 9,716,385 B2 | 7/2017 | Dickey |
| 2014/0042972 A1 * | 2/2014 | Kim .......................... H02J 7/00 |
| | | 320/118 |
| 2016/0149400 A1 * | 5/2016 | Dickey ...................... H02J 1/10 |
| | | 361/93.1 |

* cited by examiner

*Primary Examiner* — Metasebia T Retebo
(74) *Attorney, Agent, or Firm* — Brake Hughes Bellermann LLP

(57) ABSTRACT

In at least one general aspect, an apparatus can include a first field effect transistor (FET) device and a second FET device. The apparatus can include a characterization circuit coupled to the first FET device and the second FET device where the characterization circuit can be configured to characterize a responsiveness of each of the first FET device and the second FET device. The apparatus can include a balancer configured to produce a modified gate drive signal for the first FET device based on the responsiveness of the first FET device.

18 Claims, 7 Drawing Sheets

BALANCER FOR MULTIPLE FIELD EFFECT TRANSISTORS ARRANGED IN A PARALLEL CONFIGURATION

CROSS-REFERENCE TO RELATED APPLICATION

This application claims priority to and the benefit of U.S. Provisional Application No. 62/397,567 filed Sep. 21, 2016, entitled "Balancer For Multiple Field Effect Transistors Arranged in a Parallel Configuration", which is incorporated herein by reference in its entirety.

TECHNICAL FIELD

This description relates to a balancer for multiple field effect transistors that are arranged in a parallel configuration.

BACKGROUND

When a single field effect transistor (FET) has insufficient energy absorption capability, multiple FETs may be used to compensate for the insufficiency. Using multiple FETs, however, may result in additional challenges related to, for example, matching FETs. Thus, a need exists for systems, methods, and apparatus to address the shortfalls of present technology and to provide other new and innovative features.

SUMMARY

In at least one general aspect, an apparatus can include a first field effect transistor (FET) device and a second FET device. The apparatus can include a characterization circuit coupled to the first FET device and the second FET device where the characterization circuit can be configured to characterize a responsiveness of each of the first FET device and the second FET device. The apparatus can include a balancer configured to produce a modified gate drive signal for the first FET device based on the responsiveness of the first FET device.

The details of one or more implementations are set forth in the accompanying drawings and the description below. Other features will be apparent from the description and drawings, and from the claims.

DETAILED DESCRIPTION

Many systems may include multiple field effect transistors (FETs) to absorb energy in linear mode, during a switching transition, and/or so forth. In applications where a single FET has insufficient energy absorption capability, parallel power FETs can be used. However, if the thresholds of the parallel power FETs are not matched (e.g., may not be matched due to processing variation even though the FETs are produced using the same manufacturing processing steps, produced using different manufacturing processing steps), one of the parallel power FETs can absorb the majority of the energy, resulting in a condition where less than the full capacity of the parallel power FETs is being used (e.g., 1+1<2 condition). In a worst case scenario, only one of the parallel power FETs may be operating in a desirable fashion while the another of the parallel power FETs is not contributing (e.g., a worst case condition of 1+1=1). Accordingly, the use of FETs with matched thresholds may be desirable in many applications. However, obtaining FETs with matched thresholds may not be possible, or may be relatively difficult to obtain. In some implementations, testing of each of the FETs in a trial-and-error fashion may be needed to find FETs with matched thresholds, which may be time-consuming and inefficient. In some implementations, to resolve the issues described above, relatively large (e.g., larger than needed) parallel power FETs can be implemented. However, such implementations, can be susceptible to, for example, hot spotting.

A balancer can be coupled to (e.g., connected to, in communication with) multiple FET devices and can be used to produce modified gate drive signals such that the contribution of each of the multiple FET devices can be balanced. In some implementations, the balancer can be configured to drive and balance more than two FET devices. Although the implementations are generally discussed in the context of two FET devices, each of the implementations can include more than two FET devices (e.g., in parallel and/or serial configurations).

Figure 1:
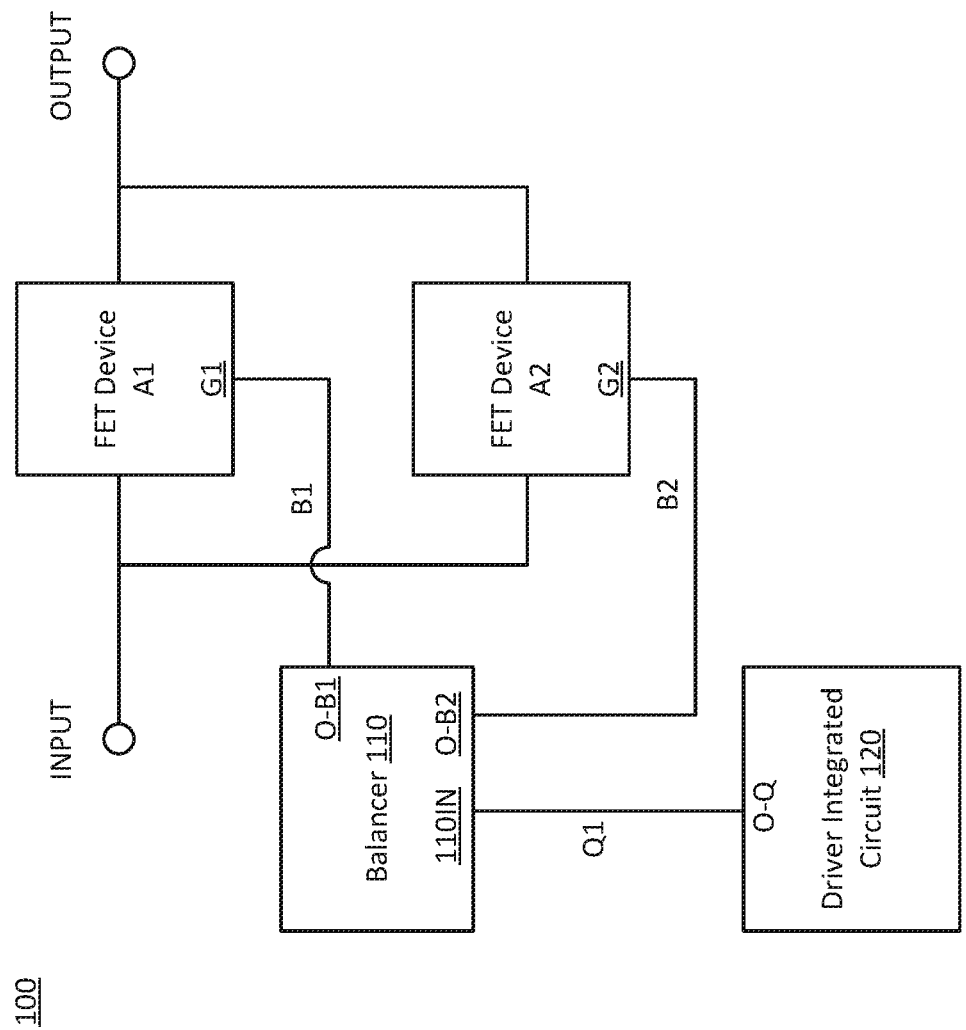
FIG. 1 is a circuit that includes multiple FET devices arranged in a parallel configuration and coupled to a balancer.

FIG. 1 is a circuit 100 that includes multiple FET devices A1, A2 arranged in a parallel configuration and coupled to a balancer 110. The FET devices A1, A2 are configured to produce an OUTPUT signal (e.g., current limited controlled output) based on an INPUT signal (e.g., V+). The balancer 110 is coupled to the respective gates G1, G2 of each of the FET devices A1, A2. In some implementations, more than two FET devices can be included in the circuit 100.

The balancer 110 is configured to produce modified gate drive signals B1, B2, respectively, from output channels O-B1, O-B2 for each of the FET devices A1, A2. If the FET devices A1, A2 are unbalanced (e.g., have unbalanced threshold voltages), the balancer 110 can be configured to produce the modified gate drive signals B1, B2 such that the contribution of each of the FET devices A1, A2 can be balanced. In other words, the balancer 110 can be configured to produce modified gate drive signals B1, B2 for each FET devices A1, A2 that compensates for variations in individual (e.g., different) threshold voltages for the FET devices A1, A2. Said differently, the balancer 110 can be configured to output one modified gate voltage per channel (per FET device A1, A2), matched to its respective threshold voltage, such that the FET devices A1, A2 operate in unison and share power in a more desirable fashion (e.g., an equal fashion).

In some implementations, the FET devices A1, A2 can intentionally be configured with different characteristics (e.g., different threshold voltages, different sizes). The balancer 110 can be configured to accommodate the different characteristics. In some implementations, the balancer 110 can be configured to provide different modified gate drive signals B1, B2 tuned to the different characteristics intentionally configured within the FET devices A1, A2. In some cases, desired power sharing between the FET devices A1, A2 will not require a difference in the modified gate drive signals B1, B2. In such instances, the balancer 110 can be configured to provide the same modified gate drive signal B1=B2 to each of the FET devices A1, A2.

The balancer 110 can be triggered to operate in response to a signal from a driver integrated circuit (IC) 120. Without the balancer 110, the driver IC 120 may typically be configured to drive 1 FET device per channel (in this case only one gate drive signal Q1 (e.g., input gate drive signal) from a channel O-Q (also can be referred to as pin)). The driver IC 120 could be configured to directly trigger the FET devices A1 and, A2 from 1 channel, O-Q, but as such, it would not compensate for threshold variation and the initial problem description of 1+1<2 would result. Accordingly, the balancer 110 is a component disposed between the driver IC 120 and the FET devices A1, A2 to achieve balanced response from each of the FET devices A1, A2. The balancer 110 is configured to drive the multiple FET devices A1, A2 in response to the single input gate drive signal Q1 (e.g., a single analog input, a single digital input) from the driver IC 120. In some implementations, the modified gate drive signal B1 and/or the modified gate drive signal B2 can be different (e.g., have a different value (e.g., voltage)) from the input gate drive signal Q1. The modified gate drive signals B1, B2 (e.g., the multiple modified gate drive signals) output from the balancer 110 can be derived from the input gate drive signal Q1 (e.g., signal input gate drive signal) input into the balancer 110.

In some implementations, the balancer 110 can be configured to eliminate (or substantially reduce) the need for matched FET's in achieving maximum power absorption capability in parallel implementations such as that shown in FIG. 1.

In some implementations, the balancer 110 can be, or can include, a control circuit including one or more input channels. In this implementation, the balancer 110 has a single input channel (i.e., input channel 110IN) from the driver IC circuit 120. In some implementations, the balancer 110 may have more than one input channel from the driver IC circuit 120.

In some implementations, the balancer 110 can be, or can include, a control circuit configured to drive one or more level shifted output channels per input channel. In the implementation shown in FIG. 1, the balancer 110 is configured to drive two output channels (e.g., output channels O-B1, O-B2) per the single input channel 110IN. In some implementations, the balancer 110 can be configured to drive one switch node (e.g., a single FET device) per input channel. In some implementations, the balancer 110 can be configured to drive one switch node (e.g., a single FET device) per output channel.

In some implementations, the balancer 110 can be configured to drive multiple switch nodes (e.g., multiple FET devices or a set of FET devices) per output channel. For example, a pair of FET devices can be triggered by a first modified gate signal from a first output channel of a balancer and a separate FET device (or FET devices) can be triggered by a second modified gate signal from a second output channel of the balancer. Accordingly, in some implementations, the balancer 110 can be configured to drive multiple switch nodes per input channel (e.g., one input channel, and two or more output channels).

Although not shown in FIG. 1, in some implementations, the balancer 110 can be, or can include, a level shifter. Accordingly, in some implementations, the balancer 110 can be configured to drive two or more level shifted output channels (e.g., output channels O-B1, O-B2) per the single input gate drive signal Q1 via the input channel 110IN.

In some implementations, the balancer 110 can be configured to multiplex multiple gate drive signals produced by the driver integrated circuit 120 and received at the balancer 110. For example, although not shown, the balancer 110 can be configured to receive a first input gate drive signal and a second input gate drive signal from the driver integrated circuit 120. The first input gate drive signal and the second input gate drive signal can be received at different input channels of the balancer 110. The balancer 110 can be configured to produce the output channels O-B1 and O-B2 based on either the modified gate drive signal B1 or the modified gate drive signal B2.

In some implementations, the driver IC 120 can be, or can include, a variety of driver integrated circuits. For example, the driver IC 120, can be, or can include, a multi-phase motor driver IC, a hot swap controller, a passive soft start circuit (e.g., a capacitor and resistor soft start circuit).

In some implementations, the balancer 110 (which can also be referred to as a multi-FET balancer) can be configured as a standalone component. In such implementations, the balancer 110 can have one or more input channels and one or more output channels. In such implementations, the balancer 110 can be coupled to a circuit including multiple FET devices. In some implementations, the balancer 110 can be integrated (e.g., integrated in a package with) with FET devices and/or a driver IC, and/or other devices.

In some implementations, the balancer 110 can be configured to produce the modified gate drive signals B1, B2 in a preset fashion. For example, in some implementations, the FET devices A1, A2 can be characterized (e.g., a responsiveness of the FET devices A1, A2 can be characterized), and the balancer 110 can be configured to produce the modified gate drive signals B1, B2 based on the characterization of the FET devices A1, A2. For example, the responsiveness of the FET devices A1, A2 in response to the modified gate drive signals B1, B2, respectively, can be characterized. More specifically, if the FET device A1 has a threshold voltage that is different than a threshold voltage of the FET device A2 (based on characterization of the FET devices A1, A2), the balancer 110 can be configured to produce different modified gate drive signals B1, B2 based on these different threshold voltage (e.g., characterized threshold voltage values) for the FET devices A1, A2. The balancer 110 can be configured so that the difference in modified gate drive signals B1, B2 can achieve a target power sharing response between FET devices A1, A2.

In some implementations, the modified gate drive signal B1, B2, can be defined so that the responsiveness of the FET devices A1, A2 each (or collectively) satisfy a specified matching condition. For example, if the FET device A1 has a threshold voltage that is different than a threshold voltage of the FET device A2 (based on characterization of the FET devices A1, A2), the balancer 110 can be configured to produce different modified gate drive signals B1, B2 based on these different threshold voltages (e.g., characterized threshold voltages) for the FET devices A1, A2. The balancer 110 can be configured so the modified gate drive signals B1, B2 will produce a responsiveness of the FET device A1 and the FET device A2 that satisfies a matching condition (e.g., a percentage difference for a particular characteristic (e.g., Rds ON, Id) less than 0.5%).

As another example, the same VDS value can be applied across FET device A1 and the FET device A2. However, because FET device A1 can have slightly different characteristics than FET device A2, FET device A1 may produce a larger Id than FET device A2 at the same gate voltage (VGS). Accordingly, in some implementations, the balancer 110 can be configured to provide a larger gate voltage to the FET device A2 than the FET device A1 so that the FET device A1 can produce an Id that is matched to that of FET device A2.

In some implementations, a feedback signal can be received from one or more of the FET devices A1, A2 so that the balancer 110 can adjust the FET devices A1, A2, in a desirable fashion during operation (e.g., dynamically during operation). More details related to a feedback signal are discussed in connection with at least FIG. 2.

Figure 2:
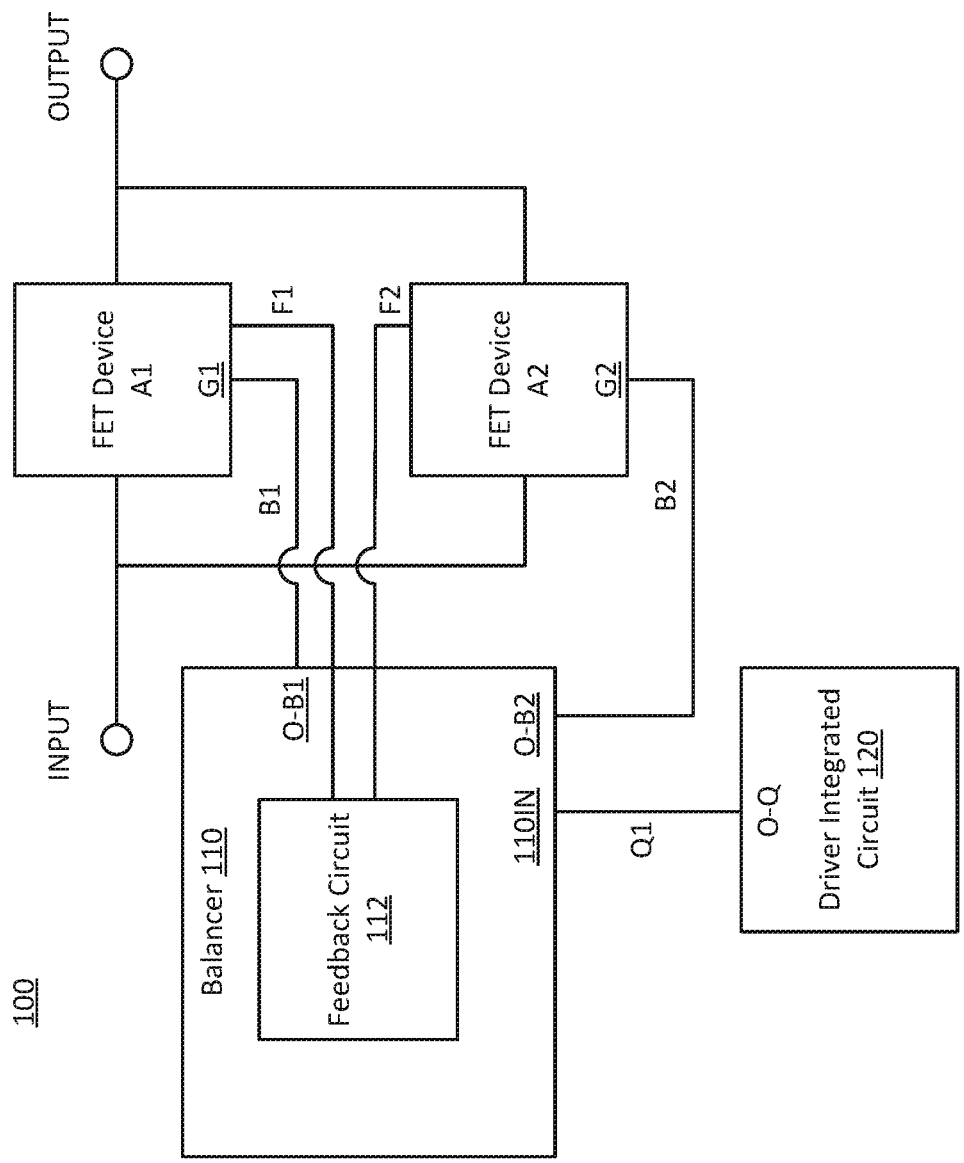
FIG. 2 illustrates a feedback circuit included in the balancer shown in FIG. 1.

FIG. 2 illustrates a feedback circuit 112 included in the balancer 110. The circuit 100 shown in FIG. 2 can be a variation of the circuit 100 shown in FIG. 1.

As shown in FIG. 2, the feedback circuit 112 can receive a feedback signal F1 from the FET device A1 and/or a feedback signal F2 from the FET device A2. The feedback signal F1 and/or F2 can be a feedback signal from any part of the FET device A1 and/or A2. For example, the feedback signal F2 can be from a source (e.g., an output) or a drain (e.g., an input) of the FET device A2.

In some implementations, during operation of the circuit 100, the balancer 110 can be configured to adjust one or more of the modified gate drive signals. For example, an Id determined based on the feedback signal F1 from the FET device A1, the balancer 110 can be configured to reduce or increase (e.g., dynamically reduce or increase during operation) the modified gate drive signal B1 to the FET device A1 relative to the modified gate drive signal B2 to the FET device A2.

In some implementations, during operation of the circuit 100, the balancer 110 can be configured to adjust one or more of the modified gate drive signals differently during different time periods. For example, during a first time period, the balancer 110 can be configured to provide the modified gate drive signal B1 having a first value to the FET device A1 based on the feedback signal F1 having a first value during the first time period. During a second time period, the balancer 110 can be configured to provide the modified gate drive signal B1 having a second value (different from the first value) to the FET device A1 based on the feedback signal F1 having a second value during the second time period.

In some implementations, the balancer 110 can be configured to produce (e.g., intentionally produce) an imbalance between the FET devices A1, A2. For example, the balancer 110 can be configured to provide a higher modified gate voltage to the FET device A1 than to the FET device A2, so that an Id of the FET device A1 is greater than an Id of the FET device A2.

Figure 3:
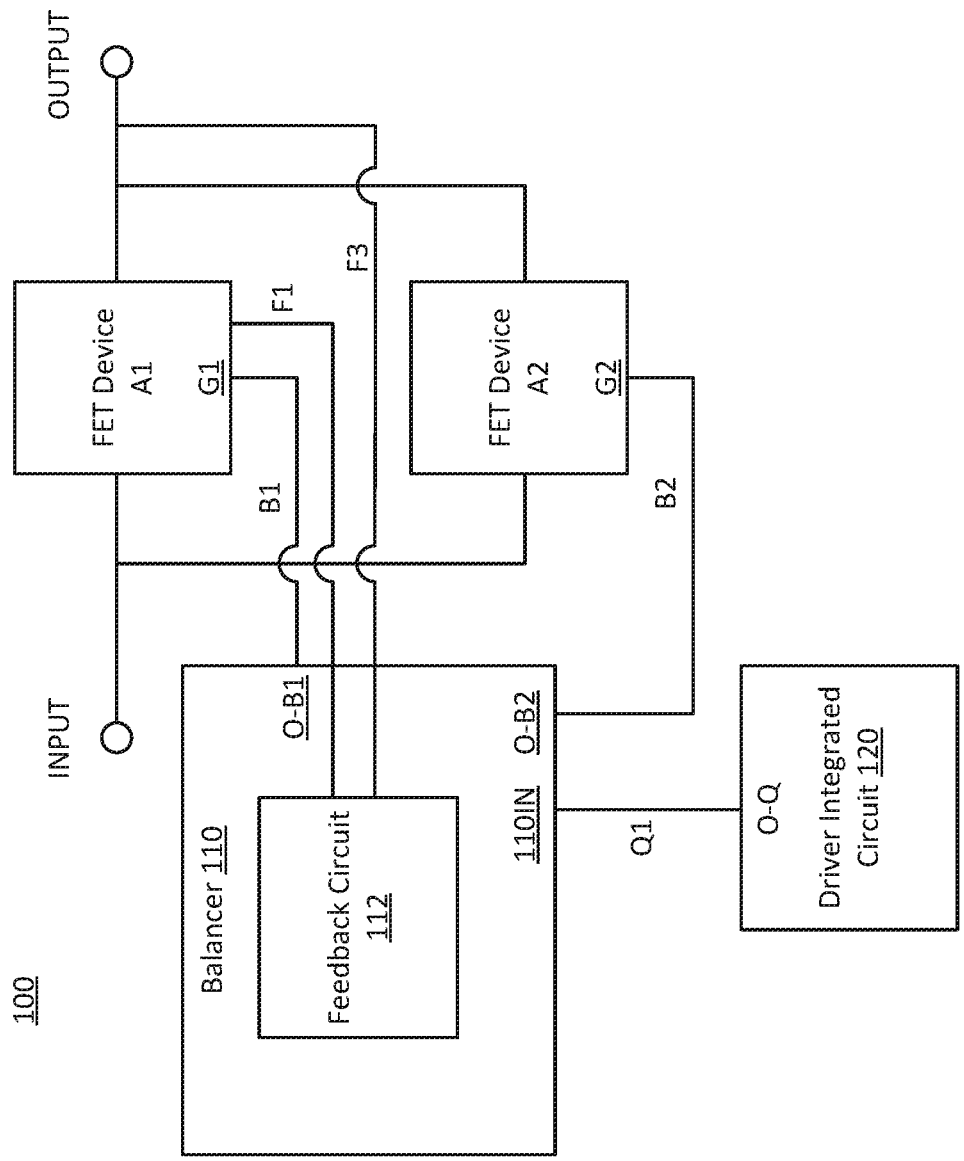
FIG. 3 illustrates a variation of the circuit shown in FIG. 2.

FIG. 3 illustrates a variation of the circuit 100 shown in FIG. 2. As shown in FIG. 3, the feedback circuit 112 is configured to receive a feedback signal F3 from the output of the circuit 100 and the FET device A1. The output of the circuit 100 can be a combination of the outputs of the FET devices A1, A2. Accordingly, the feedback circuit 112 can be configured to resolve characteristics about the FET devices A1, A2 based on the output of the circuit 100 and the feedback signal F1 of the FET device A1.

Although not shown, in some implementations, the balancer 110 can be configured to produce the targeted different modified gate drive signals B1, B2 via, for example, an external component (e.g., a data bus, microcontroller, etc.). In some implementations, the FET devices A1, A2 can be characterized, and the balancer 110 can be configured to produce the different modified gate drive signals B1, B2 via the external component based on the characterization.

Figure 4:
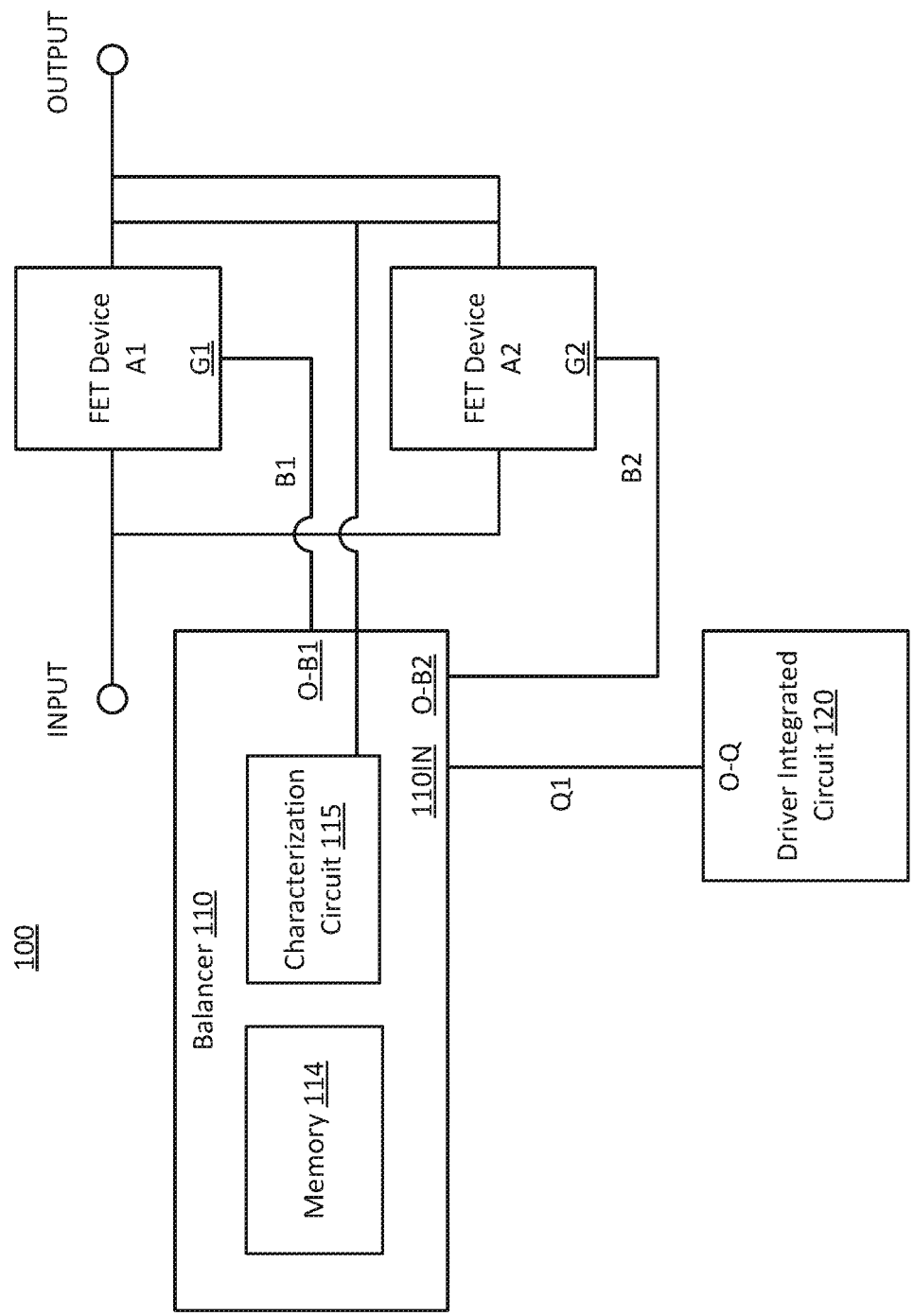
FIG. 4 illustrates a characterization circuit included in the balancer shown in FIG. 1.

In some implementations, the balancer 110 can be configured to produce the modified gate drive signals B1, B2 based on characterization of the FET devices A1, A2 performed by a characterization circuit (also can be referred to as a self-detection circuit). In some implementations, the characterization circuit can be configured to characterize each of the FET devices A1, A2. FIG. 4 illustrates an example implementation of a characterization circuit.

FIG. 4 illustrates a characterization circuit 115 included in the balancer 110 shown in FIG. 1. The characterization circuit 115 can be configured to characterize (e.g., characterize a responsiveness of) one or more of the FET devices A1, A2 during a characterization time period or stage so that during operation (during an operation time period or stage), the balancer 110 can provide a modified gate drive signal B1, B2 to the FET devices A1, A2. The characterization time period can be performed during a testing phase of the circuit 100. The characterization can be performed during a time period before normal operation of the circuit 100. The characterization circuit 115 may not be used during normal operation of the circuit 100 after the FET devices A1, A2 have been characterized. Although not shown in FIG. 4, the balancer 110 including the characterization circuit 115 can be combined with any of the features (e.g., feedback circuit 112) described herein.

As shown in FIG. 4, the characterization circuit 115 is coupled on an output side of each of the FET device A1, A2. In some implementations, the characterization circuit 115 can be configured to trigger the balancer 110 to turn on each of the FET devices A1, A2 one at a time (e.g., in a serial fashion) at a known slew rate, and determine at what gate voltage a critical voltage is achieved at the output of each of the FET devices A1, A2. The characterization circuit 115 can be configured to cycle through each channel of the balancer 110 in such a fashion, turning on only one of the FET devices A1, A2 at a time, and recording the gate voltage needed to achieve the critical voltage on the output. The differences in gate voltages for each of the FET devices A1, A2 to attain the critical output voltage can be used as (e.g., programmed as) the level shift set points to generate the different modified gate drive signals B1, B2 to be produced by the balancer 110 during normal operation.

In some implementations, such characterization can be performed by the characterization circuit 115 during a characterization time period, which can include, for example, end application system testing. In some implementations, the characterization circuit 115 can be configured to store characterization information (e.g., parameters) in a memory 114. The characterization information can be retrieved from the memory 114 (e.g., retrieved during normal operation) and used by the balancer 110 to produce the modified gate drive signals B1, B2.

In some implementations, the characterization circuit 115 can be configured to characterize the FET devices A1, A2 a single time. In some implementations, the characterization circuit 115 can be configured to characterize the FET devices A1, A2 periodically. In some implementations, the characterization circuit 115 can be configured to characterize the FET devices A1, A2 between normal operation time periods.

Figure 7:
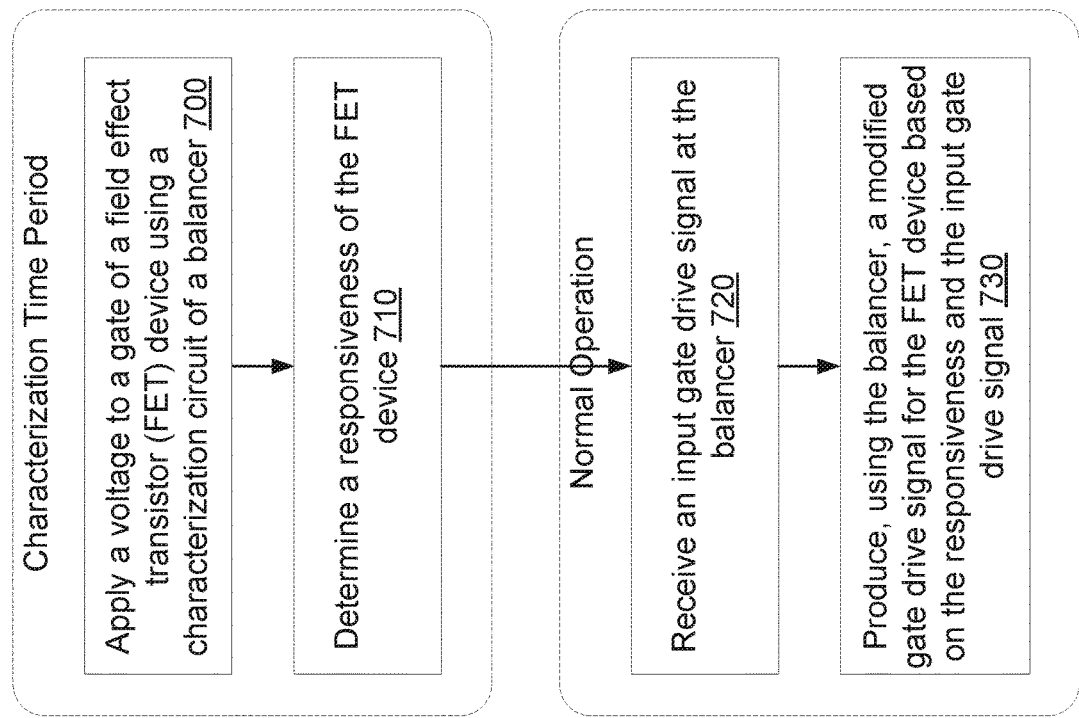
FIG. 7 illustrates an example characterization and operation process.

An example characterization and operation process is illustrated in at least FIG. 7. Apply a voltage to a gate of an FET device using a characterization circuit of a balancer (block 700). In some implementations, the voltage applied to the gate can be an input gate drive signal or can be a simulated input gate drive signal. As shown in FIG. 7, a responsiveness of the FET device can be determined (block 710). The FET device can be in parallel with another FET device. Determining the responsiveness can include determining a characteristic of the FET device, for example, in response to the voltage applied to the gate of the FET device. Blocks 700 and 710 can be performed during, for example, a characterization time period separate from (or during normal operation) from a circuit including the FET device.

An input gate drive signal can be received at the balancer (during an operation) of the FET device (block 720). A modified gate drive signal can be produced, using the balancer, for the FET device based on the responsiveness and the input gate drive signal (block 730). The modified gate drive signal can be produced so that the FET device can have a responsiveness (e.g., characteristic) that matches (or substantially matches or is equal to) a responsiveness of another FET device (e.g., another FET device in parallel with the FET device).

Referring back to FIG. 4, although not shown, in some implementations, the characterization circuit 115 can be, or can include, a load to ground and/or a critical voltage sense circuit. In some implementations, the characterization circuit 115 may be a relatively complex circuit configured to provide FET device A1 and/or A2 characterization accuracy and ultimate threshold control. For example, the characterization circuit 115 may include differential voltage measurements across each FET device A1 and/or A2, a current sensing circuit, and/or another control circuits to improve characterization accuracy. An example control circuit may include, for example, a ground shorting switch at the output of the FET devices A1 and/or A2, controlled by characterization circuit 115 or an automatic test equipment tester, that can be used to short one or more of the FET devices A1 and/or A2 during characterization, to remove the impact of load variations in the finished circuit.

In some implementations, the balancer 110 can be configured to dynamically (e.g., dynamically based on feedback) change values (e.g., voltages) produced by the modified gate drive signals B1, B2 based on the responsiveness (e.g., on characteristics and/or switching characteristics based on threshold voltage values) of the FET devices A1, A2. In some implementations, such adjustment of values produced by the balancer 110 can be triggered (e.g., periodically, randomly, on a schedule) by the characterization circuit 115.

Although only two FET devices are illustrated in this example circuit shown in FIG. 1, in some implementations, more than two FET devices can be included a circuit. In addition, in some implementations, more than one balancer and/or more than one driver IC can be implemented in a circuit.

Figure 5:
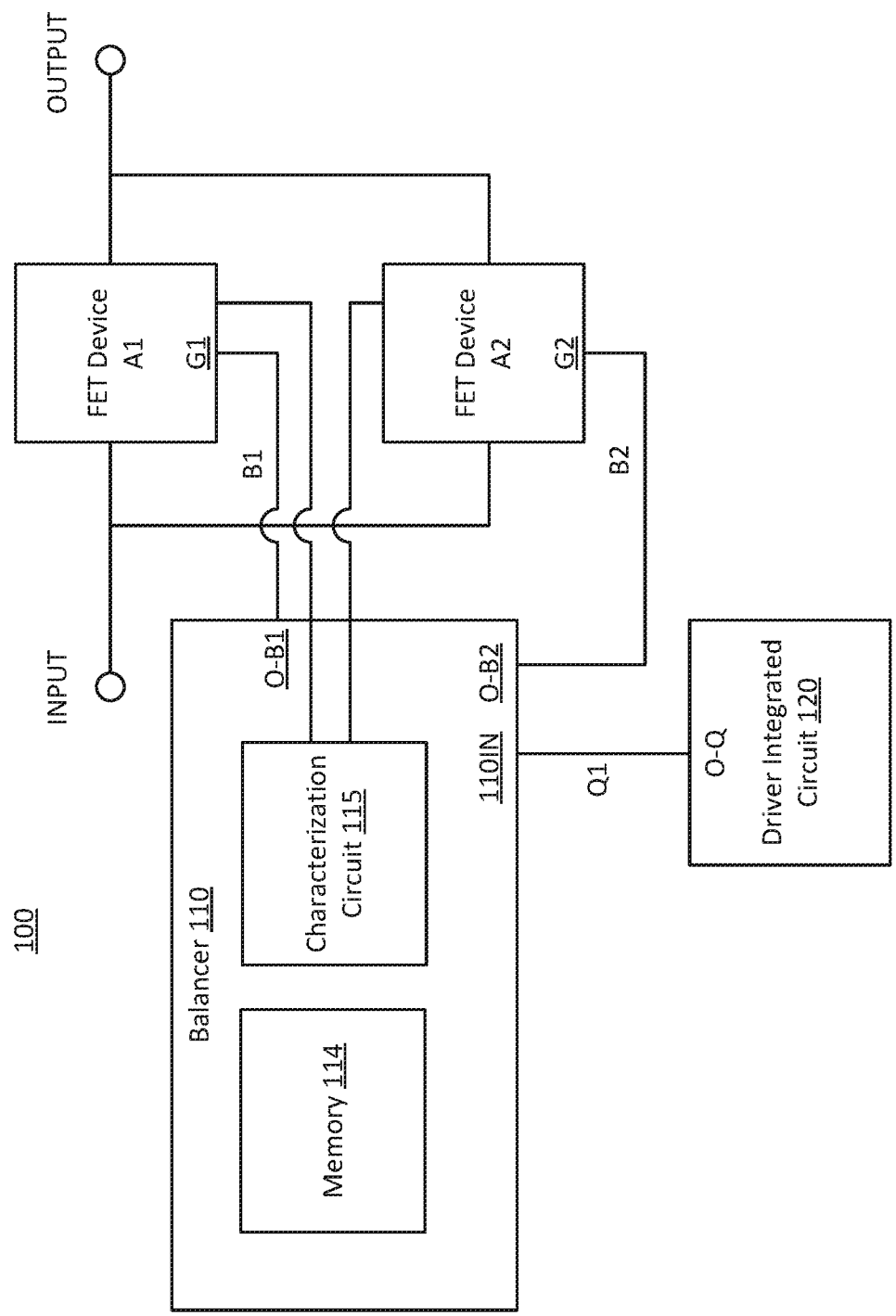
FIG. 5 is a diagram that illustrates a characterization circuit configured to characterize devices in parallel.

FIG. 5 is a diagram that illustrates a characterization circuit configured to characterize the FET devices A1, A2 in parallel. The characterization circuit can be configured to characterize both of the FET devices A1, A2 at the same time (e.g., during overlapping time periods) during, for example, a characterization time period.

Figure 6:
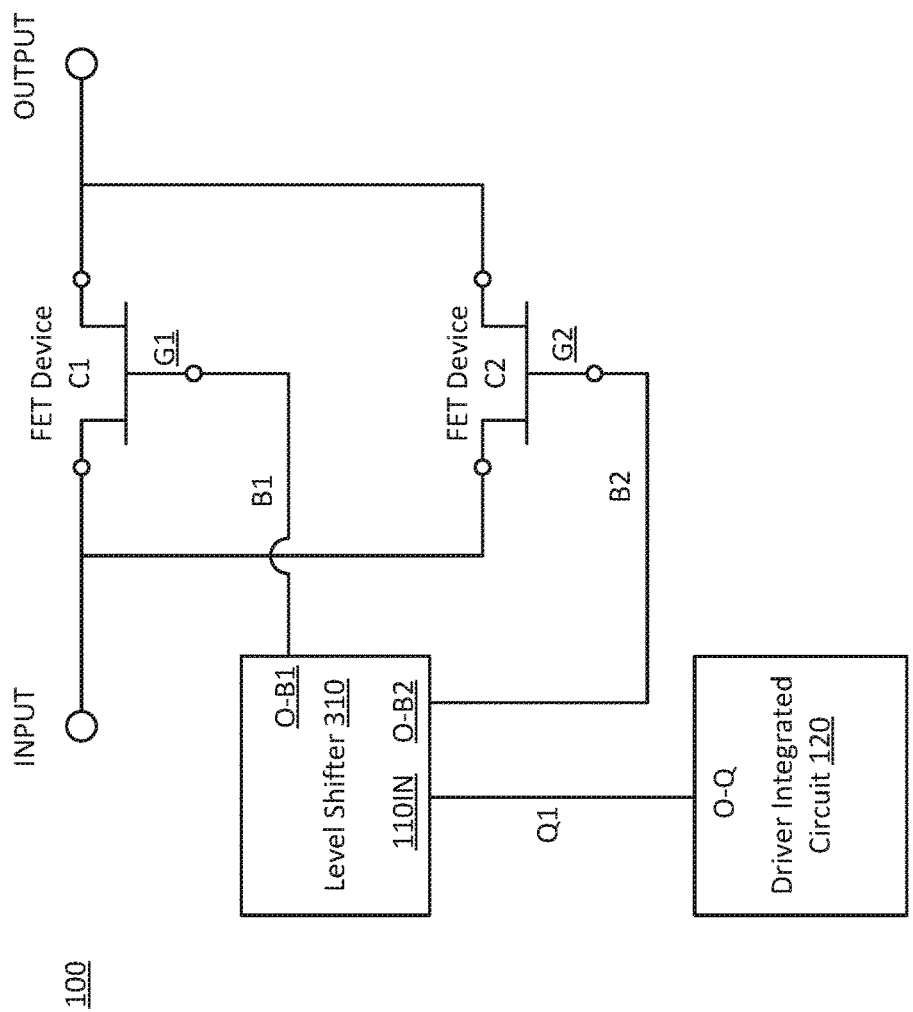
FIG. 6 is a variation of the circuit shown in FIG. 1.

FIG. 6 is a diagram that illustrates a variation of the circuit 100 shown in, for example, FIG. 1 with FET devices C1 and C2 and a level shifter 310 operating as the balancer 110 shown in FIG. 1. The variation of the circuit 100 show in FIG. 6 can include any of the features of the circuits described herein.

As shown in FIG. 6, the level shifter 310 is configured to produce modified gate drive signals B1, B2, respectively, from output channels O-B1, O-B2 for each of the FET devices C1, C2. If the FET devices C1, C2 are, for example, unbalanced (e.g., having unbalanced (e.g., different) threshold voltages), the level shifter 310 can be configured to produce the modified gate drive signals B1, B2 such that the contribution of each of the FET devices C1, C2 can be balanced. In other words, the level shifter 310 can be configured to produce modified gate drive signals B1, B2 for each FET devices C1, C2 that compensates for variations in individual (e.g., different) threshold voltages for the FET devices C1, C2. This configuration can eliminate (e.g., reduce) the need for matched FETs in achieving maximum power absorption capability in parallel implementations.

In one general aspect, an apparatus may include multiple FET devices, and a balancer coupled to each of the multiple FET devices. The balancer may be configured to produce respective drive signals from output channels for each of the FET devices and compensate for variations in different threshold voltages between the multiple FET devices.

Implementations can include one or more of the following features. For example, the balancer may be configured to output one voltage for each FET device and match its respective threshold voltage such that the multiple FET devices operate equally (e.g., satisfy a matching condition that represents a specified level of equal responsiveness or performance). The balancer may be configured to accommodate for multiple FET devices having at least one of different threshold voltages or different sizes.

In some implementations, the apparatus may include a driver integrated circuit. The balancer may be configured to drive the multiple FET devices in response to an input gate drive signal produced from the driver integrated circuit. The balancer may be disposed between the driver integrated circuit and the multiple FET devices to achieve a balanced response from each of the multiple FET devices. The balancer may include a single input channel and two or more output channels. The balancer may be configured to drive at least two output channels per the single input channel. The balancer may be configured to multiplex the input gate drive signal produced by the driver integrated circuit and received at the input channel. The balancer may include a level shifter configured to drive two or more level shifted output channels per an input channel. The balancer may be configured to produce the respective drive signals based on characterization of each of the multiple FET devices. The multiple FET devices may be arranged in parallel manner.

In some implementations, the balancer may include a characterization circuit. The characterization circuit may be configured to trigger the balancer to turn on each of the multiple FET devices one at a time at a predetermined slew rate, and may determine a critical output voltage of the multiple FET devices. The characterization circuit may further be configured to use differences in gate voltages for each of the multiple FET devices to attain the critical output voltage produced by the balancer during normal operation. The balancer may be configured to dynamically change voltages produced by the respective drive signals based on switching characteristics of the multiple FET devices.

In another general aspect, an apparatus may include multiple FET devices, and a level shifter coupled to each of the multiple FET devices. The level shifter may be configured to produce respective drive signals from output channels for each of the FET devices and compensate for variations in different threshold voltages for the multiple FET devices.

In at least one implementations, an apparatus can include a first field effect transistor (FET) device, a second FET device, and a characterization circuit coupled to the first FET device and the second FET device. The characterization circuit can be configured to characterize a responsiveness of each of the first FET device and the second FET device. The apparatus can include a balancer configured to produce a modified gate drive signal for the first FET device based on the responsiveness of the first FET device.

In some implementations, the balancer is configured to produce the modified gate drive signal to compensate for a difference between a threshold voltage of the first FET device and a threshold voltage of the second FET device. In some implementations, the balancer is configured to produce the modified gate drive signal so that an output of the first FET device is within a specified voltage range of an output voltage of the second FET device. In some implementations, the modified gate drive signal is a first modified gate drive signal. The balancer can be configured to produce a second modified gate drive signal for the second FET device based on the responsiveness of the second FET device. The balancer can be configured to produce the first modified gate drive signal and the second modified gate drive signal based on a single input gate drive signal.

In at least one general aspect, the apparatus can include a driver integrated circuit. The balancer can be configured to produce the modified gate drive signal for the first FET device based on an input gate drive signal produced from a driver integrated circuit. In some implementations, the balancer is configured to multiplex the input gate drive signal produced by the driver integrated circuit. In some implementations, the modified gate drive signal is a first modified gate drive signal. The balancer can be configured to produce a second modified gate drive signal for the second FET device based on the responsiveness of the second FET device. The balancer can be configured to produce the first modified gate drive signal and the second modified gate drive signal based on a single input gate drive signal, the first modified gate drive signal being different from the second modified gate drive signal and different from the single input gate drive signal. The apparatus can include any of the combination of the elements below.

In some implementations, the first FET device is parallel to the second FET device. In some implementations, the balancer includes a level shifter. In some implementations, the apparatus can include further comprising a driver integrated circuit. The balancer can be disposed between the driver integrated circuit and both of the first FET device and second FET device to trigger a balanced response between the first FET device and the second FET device. In some implementations, the characterization circuit can be configured to trigger the balancer to turn on each of the first FET device and the second FET device, one at a time, to determine a critical output voltage each of the first FET device and the second FET device.

In some implementations, the characterization circuit is configured to use differences in gate voltages for each of the first FET device and the second FET device to determine a critical output voltage produced by the balancer during normal operation. In some implementations, the balancer is configured to dynamically change a voltage of the modified drive signal based on feedback signal from the first FET device.

In another general aspect, an apparatus can include a plurality of field effect transistor (FET) devices and a characterization circuit coupled to the plurality of FET devices. The characterization circuit can be configured to characterize a responsiveness of each of the plurality of FET devices during a characterization time period. The apparatus can include a balancer configured to produce a plurality of modified gate drive signals for the plurality of FET devices during normal operation after the characterization time period. The plurality of modified gate drive signals can be based on an input gate drive signal. The apparatus can include any of the combination of the elements below.

In some implementations, at least one of the modified gate drive signals is different from the input gate drive signal. In some implementations, the balancer is configured to produce the plurality of modified gate drive signals to compensate for differences between threshold voltages of the plurality of FET devices. In some implementations, the apparatus can include a driver integrated circuit configured to produce the input gate drive signal.

In another general aspect, an apparatus can include a plurality of multiple FET devices and a balancer coupled to each of the plurality of FET devices. The balancer can be configured to produce a modified gate drive signal for each of the plurality of FET devices to compensate for differences in threshold voltages for each of the plurality of FET devices. The apparatus can include any of the combination of the elements below.

In some implementations, the balancer is configured to produce the respective modified gate drive signals for each of the plurality of FET devices such that a responsiveness of each of the plurality of FET devices satisfies a matching condition. In some implementations, the balancer is configured to produce the respective modified gate drive signals for each of the plurality of FET devices based on characterization of each of the plurality of FET devices.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Implementations may be implemented in a computing system that includes a back end component, e.g., as a data server, or that includes a middleware component, e.g., an application server, or that includes a front end component, e.g., a client computer having a graphical user interface or a Web browser through which a user can interact with an implementation, or any combination of such back end, middleware, or front end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Galium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus comprising:
a first field effect transistor (FET) device;
a second FET device;
a characterization circuit coupled to the first FET device and the second FET device, the characterization circuit configured to characterize a threshold voltage of each of the first FET device and the second FET device; and
a balancer directly coupled to a gate of the first FET device and directly coupled to a gate of the second FET device, the balancer configured to produce a first modified gate drive signal directly to the gate of the first FET device based on the threshold voltage of the first FET device and based on an input gate drive signal, the balancer configured to produce a second modified gate drive signal, different from the first modified gate signal and different from the input gate drive signal, directly to the gate of the second FET device based on the threshold voltage of the second FET device and based on the input gate drive signal, the balancer being configured to produce the first modified gate drive signal to compensate for a difference between the threshold voltage of the first FET device and the threshold voltage of the second FET device.

2. The apparatus of claim 1, wherein the balancer is configured to produce the modified gate drive signal so that an output of the first FET device is within a specified voltage range of an output voltage of the second FET device in response to the input gate drive signal.

3. The apparatus of claim 1, wherein the input gate drive signal is a single input gate drive signal, the modified gate drive signal is the first modified gate drive signal, the balancer is configured to produce the second modified gate drive signal for the second FET device based on the threshold voltage of the second FET device,
the balancer is configured to produce the first modified gate drive signal and the second modified gate drive signal based on the single input gate drive signal.

4. The apparatus of claim 1, further comprising a driver integrated circuit, wherein the balancer is configured to produce the modified gate drive signal for the first FET device based on the input gate drive signal produced from the driver integrated circuit.

5. The apparatus of claim 4, wherein the balancer is configured to multiplex the input gate drive signal produced by the driver integrated circuit.

6. The apparatus of claim 1, wherein the input gate drive signal is a single input gate drive signal, the modified gate drive signal is the first modified gate drive signal, the balancer is configured to produce the second modified gate drive signal for the second FET device based on the threshold voltage of the second FET device,
the balancer is configured to produce the first modified gate drive signal and the second modified gate drive signal based on the single input gate drive signal, the first modified gate drive signal being different from the second modified gate drive signal and different from the single input gate drive signal.

7. The apparatus of claim 1, wherein the first FET device is parallel to the second FET device.

8. The apparatus of claim 1, further comprising a driver integrated circuit,
wherein the balancer is disposed between the driver integrated circuit and both of the first FET device and second FET device to trigger a balanced response between the first FET device and the second FET device.

9. The apparatus of claim 1, wherein the characterization circuit is configured to trigger the balancer to turn on each of the first FET device and the second FET device, one at a time, to determine a critical output voltage each of the first FET device and the second FET device.

10. The apparatus of claim 1, wherein the characterization circuit is configured to use differences in gate voltages for each of the first FET device and the second FET device to determine a critical output voltage produced by the balancer during normal operation.

11. The apparatus of claim 1, further comprising a single input coupled to both the first FET device and the second FET device.

12. An apparatus comprising:
a plurality of field effect transistor (FET) devices;
a characterization circuit coupled to the plurality of FET devices, the characterization circuit configured to characterize a threshold voltage of each of the plurality of FET devices during a characterization time period; and
a balancer directly coupled to each gate of each of the plurality of FET devices, the balancer configured to produce a plurality of modified gate drive signals for the plurality of FET devices during normal operation after the characterization time period, the plurality of modified gate drive signals being configured to compensate for differences in the threshold voltages of the plurality of FET devices such that a power output from each of the plurality of FET devices, when turned on, is equal in response to a single input gate drive signal.

13. The apparatus of claim 12, wherein at least one of the modified gate drive signals is different from the single input gate drive signal.

14. The apparatus of claim 12, further comprising a driver integrated circuit configured to produce the single input gate drive signal.

15. The apparatus of claim 12, wherein each of the modified gate drive signals is different from the remaining modified gate drive signals.

16. An apparatus comprising:
a plurality of FET devices; and
a balancer directly coupled to a gate of each of the plurality of FET devices, the balancer configured to produce a plurality of modified gate drive signals for the gates of each of the plurality of FET devices in response to a single gate drive signal, at least one of the plurality of modified gate drive signals being configured to compensate for a difference in threshold voltages between at least a pair of the plurality of FET devices such that a power output from each of the plurality of FET devices, when turned on, is equal in response to the single gate drive signal.

17. The apparatus of claim 16, wherein the balancer is configured to produce the at least one of the plurality of modified gate drive signals such that a responsiveness of the pair of the plurality of FET devices satisfies a matching condition in response to the single gate drive signal.

18. The apparatus of claim 16, wherein the balancer is configured to produce the at least one of the plurality of modified gate drive signals for based on characterization of the pair of the plurality of FET devices.

* * * * *